(12) United States Patent
Kim et al.

(10) Patent No.: US 7,408,371 B2
(45) Date of Patent: Aug. 5, 2008

(54) APPARATUS FOR MEASURING ON-CHIP CHARACTERISTICS IN SEMICONDUCTOR CIRCUITS AND RELATED METHODS

(75) Inventors: Tak-Yung Kim, Seoul (KR); Jin-Yong Lee, Seoul (KR); Shin-Mo Kang, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 269 days.

(21) Appl. No.: 11/416,374

(22) Filed: May 2, 2006

(65) Prior Publication Data
US 2007/0080701 A1 Apr. 12, 2007

(30) Foreign Application Priority Data
Oct. 8, 2005 (KR) .................. 10-2005-0094641

(51) Int. Cl.
G01R 31/26 (2006.01)
G01R 31/28 (2006.01)

(52) U.S. Cl. .................. 324/765; 324/158.1; 714/731; 713/765; 368/107

(58) Field of Classification Search .................. 714/731; 713/400; 324/765; 368/107–121
See application file for complete search history.

(56) References Cited

U.S. PATENT DOCUMENTS

| | | | | |
|---|---|---|---|---|
| 5,341,096 A | * | 8/1994 | Yamamura | .................. 324/765 |
| 5,619,463 A | * | 4/1997 | Malhi | .................. 365/201 |
| 6,611,477 B1 | * | 8/2003 | Speyer et al. | .................. 368/113 |
| 6,633,991 B1 | * | 10/2003 | Goldrian | .................. 713/400 |
| 6,888,414 B2 | * | 5/2005 | Albean | .................. 331/57 |
| 2002/0144195 A1 | | 10/2002 | Ramanathan et al. | |
| 2005/0094448 A1 | | 5/2005 | Lee et al. | |

FOREIGN PATENT DOCUMENTS

| | | |
|---|---|---|
| JP | 2003-529082 | 9/2003 |
| JP | 2004-132824 | 4/2004 |
| KR | 2002-0086684 | 11/2002 |
| WO | WO 01/73457 A2 | 10/2001 |

* cited by examiner

*Primary Examiner*—Ha Nguyen
*Assistant Examiner*—Emily Chan
(74) *Attorney, Agent, or Firm*—Myers Bigel Sibley & Sajovec, PA

(57) ABSTRACT

An apparatus for measuring on-chip characteristics in a semiconductor circuit is provided. The apparatus for measuring the on-chip characteristics includes an oscillation unit, a timing test unit, and a selection unit. The oscillation unit is configured to selectively output a first oscillation signal responsive to a first control signal. The timing test unit is configured to generate a second oscillation signal using an input clock signal, generate a pulse from the second oscillation signal responsive to a second control signal, and determine whether an operating time violation has occurred based on a comparison of the second oscillation signal and the pulse. The selection unit is configured to select one of the output of the oscillation unit and the output of the timing test unit responsive to a test mode signal. The apparatus is configured to measure an on-chip delay using a period of the first oscillation, or to measure a timing margin of the semiconductor circuit using an output of the timing test unit, based on an output of the selection unit.

37 Claims, 11 Drawing Sheets

APPARATUS FOR MEASURING ON-CHIP CHARACTERISTICS IN SEMICONDUCTOR CIRCUITS AND RELATED METHODS

CROSS-REFERENCE TO RELATED APPLICATIONS

This application claims priority from Korean Patent Application No. 10-2005-0094641, filed on Oct. 8, 2005 in the Korean Intellectual Property Office, the disclosure of which is incorporated by reference herein in its entirety.

FIELD OF THE INVENTION

The present invention relates to semiconductor devices, and, more particularly, to apparatus and methods for determining semiconductor device characteristics.

BACKGROUND OF THE INVENTION

With the development of very deep sub-micron (VDSM) technology, semiconductor design and processing techniques may require increasing complexity. In addition, on-chip variations may occur, for example, due to changes in power supply voltage and/or temperature. For instance, semiconductor device characteristics measured using a Test Element Group (TEG) in a scribe lane may not properly reflect the characteristics of the actual devices that may be present in a chip. As such, it may be difficult to set timing margins that may be suitable for proper device operation.

More particularly, in circuits manufactured using very deep sub-micron technology, the clock frequency may be increased to the GHz range in order to achieve higher performance. Therefore, the period of the clock signal may be decreased below the nanosecond range. However, in a single circuit, the clock signal may control data flow under timing constraints from thousands of registers. To satisfy these timing constraints, it may be necessary to control the timing of the delay of the signals that reach each register, as the timing constraints may be violated when the signal delay is different from a target value. Such a violation of the timing constraints may cause an erroneous system operation. Accordingly, it may be desirable to measure the propagation delay and timing margin of signals in the system.

However, according to conventional methods of measuring on-chip delay and/or setup/hold timing margin in a semiconductor device, a test chip and/or a special logic, such as a digital locked loop (DLL) may be used. As such, the actual data path of a synchronous circuit may not be reflected. As a result, it may be difficult to design an application-specific integrated circuit (ASIC) and/or a system on-chip (SOC) using conventional methods.

SUMMARY OF THE INVENTION

Some embodiments of the present invention provide an apparatus for measuring an on-chip delay in a semiconductor circuit by generating an oscillation signal according to a test mode, and an apparatus for measuring a timing margin based on a clock frequency.

According to some embodiments of the present invention, there is provided an apparatus for measuring on-chip characteristics in a semiconductor circuit. The apparatus may include an oscillation unit, a timing test unit, and a selection unit. The oscillation unit may be configured to selectively output a first oscillation signal responsive to a first control signal. The timing test unit may be configured to generate a second oscillation signal using an input clock signal, generate a pulse from the second oscillation signal responsive to a second control signal, and determine whether an operating time violation has occurred based on a comparison of the second oscillation signal and the pulse. The selection unit may be configured to select one of the output of the oscillation unit and the output of the timing test unit responsive to a test mode signal. The apparatus may be configured to measure an on-chip delay using a period of the first oscillation, and/or to measure a timing margin of the semiconductor circuit using an output of the timing test unit, based on an output of the selection unit.

According to other embodiments of the present invention, there is provided an apparatus for measuring a timing margin in a semiconductor circuit. The apparatus may include a clock tree synthesizer, a setup timing tester, a hold timing tester, and a selector. The clock tree synthesizer may be configured to synthesize a clock tree from an input clock signal and output a first clock set and a second clock set respectively including a plurality of sequential clock signals. The setup timing tester may be configured to generate a first oscillation signal using a first clock signal of the first clock set, delay the first oscillation signal responsive to a control signal, generate a first pulse using a clock signal of the second clock set in response to the delayed first oscillation signal, and determine whether a setup time violation has occurred based on a comparison of the first oscillation signal and the first pulse. The hold timing tester may be configured to generate a second oscillation signal using a second clock signal of the first clock set, delay the plurality of clock signals of the second clock set responsive to the control signal, receive the second oscillation signal and generate a second pulse using the delayed plurality of clock signals of the second clock set, and determine whether a hold time violation has occurred based on a comparison of the second oscillation signal and the second pulse. The selector may be configured to select and output an output of the setup timing tester or an output of the hold timing tester responsive to a selection signal. The apparatus may be configured to measure the timing margin in the semiconductor circuit based on an output of the selector indicating whether the setup or hold time violation has occurred.

According to further embodiments of the present invention, a method for measuring on-chip characteristics in a semiconductor circuit may include internally generating a first oscillation signal having a desired oscillation frequency. The first oscillation signal may be generated responsive to a first control signal. A second oscillation signal may be generated using an input clock signal. A pulse may be generated using the second oscillation signal responsive to a second control signal. Based on a comparison of the second oscillation signal and the pulse, it may be determined whether an operating time violation has occurred. The first oscillation signal and/or an indication of whether the operating time violation has occurred may be selectively provided responsive to a test mode signal. An on-chip delay of the semiconductor circuit may be determined based on a period of the first oscillation signal responsive to selectively providing the first oscillation signal. A timing margin of the semiconductor circuit may be determined based on the indication of whether the operating time violation has occurred responsive to selectively providing the indication.

DETAILED DESCRIPTION OF EMBODIMENTS OF THE INVENTION

Figure 1:
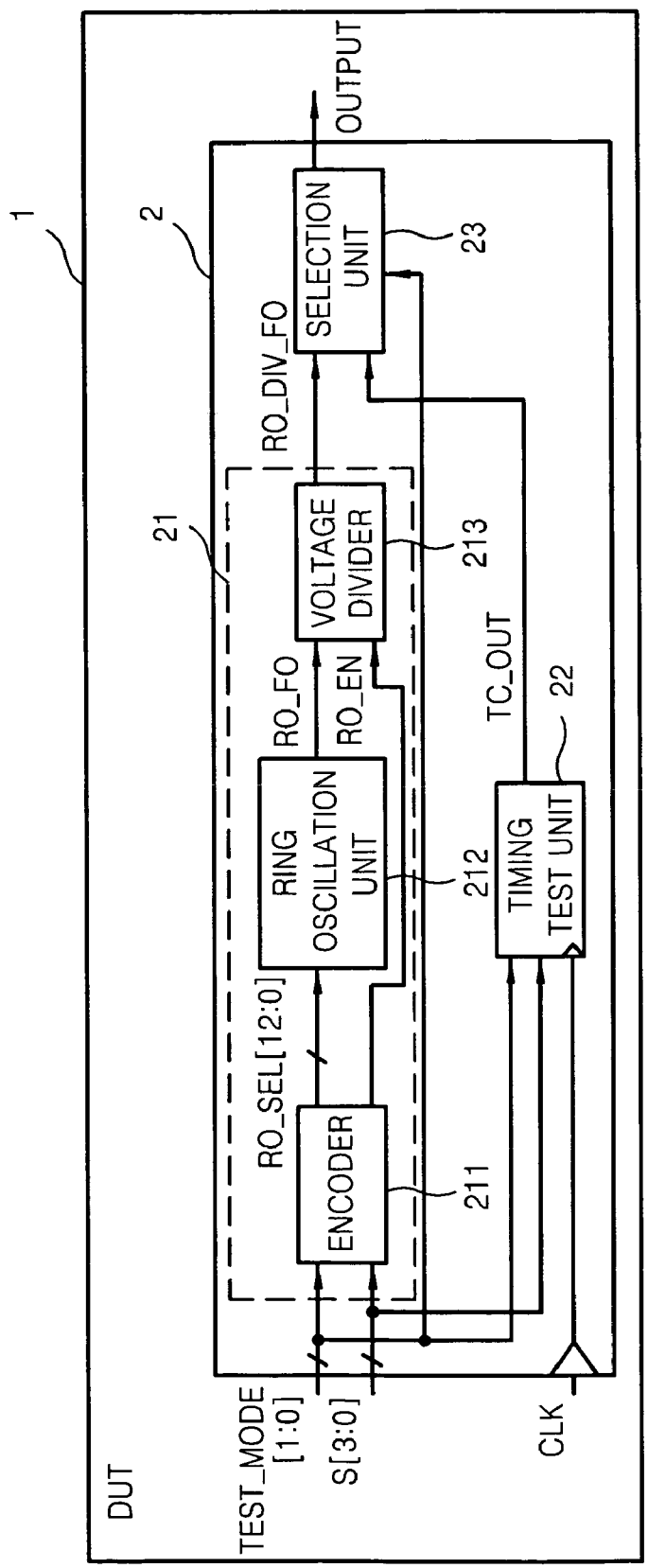
FIG. 1 is a block diagram of an apparatus for measuring on-chip characteristics according to some embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of an apparatus 2 for measuring on-chip characteristics according to some embodiments of the present invention. The apparatus 2 is included in a device under test (DUT) 1. The apparatus 2 may be manufactured using the same fabrication processes as the other circuits in the DUT 1, but may be separate from the other circuits.

The apparatus 2 includes an oscillation unit 21, a timing test unit 22, and a selection unit 23. The oscillation unit 21 outputs a plurality of oscillation signals having diverse frequencies according to an input control signal S[3:0]. An on-chip delay can be measured using the oscillation signals. More particularly, a first period may be determined from a frequency of an output oscillation signal. An on-chip delay according to characteristics of the DUT 1 can be obtained by determining a difference between the first period and a target value, i.e., a second period. Here, the second period can be obtained from a frequency of an oscillation signal obtained by performing a simulation with respect to the oscillation unit 21, for example, using a simulation program such as SPICE.

The timing test unit 22 tests a setup/hold time based on a frequency of a clock signal CLK, and outputs a signal TC_OUT as a logic "high" or "low", respectively indicating "pass" or "fail" as the test result. The setup time is the minimum amount of time that a data signal should be held at a constant value before a clock signal reaches a device, while the hold time is the minimum amount of time that a data signal should be held at a constant value after the device is enabled by the clock signal.

The selection unit 23 is configured to output a logic low signal indicating a standby state, an output signal RO_DIV_FO of a voltage divider 213, or the output signal TC_OUT of the timing test unit 22, based on a test mode signal TEST_MODE[1:0] used as a selection signal.

The oscillation unit 21 includes an encoder 211, a ring oscillation unit 212, and the voltage divider 213. The encoder 211 generates a ring oscillation pattern signal RO_SEL[12:0] using the 2-bit test mode signal TEST_MODE[1:0] and the 4-bit control signal S[3:0]. The ring oscillation unit 212 includes a plurality of ring oscillators and outputs an oscillation signal RO_FO from the ring oscillator enabled according to the ring oscillation pattern signal RO_SEL[12:0]. The oscillation signal RO_FO has a frequency in the GHz range.

The voltage divider 213 divides the GHz-oscillation signal RO_FO into MHz-oscillation signals RO_DIV_FO according to a predetermined division ratio, based on the characteristics of the apparatus 2.

Figure 2:
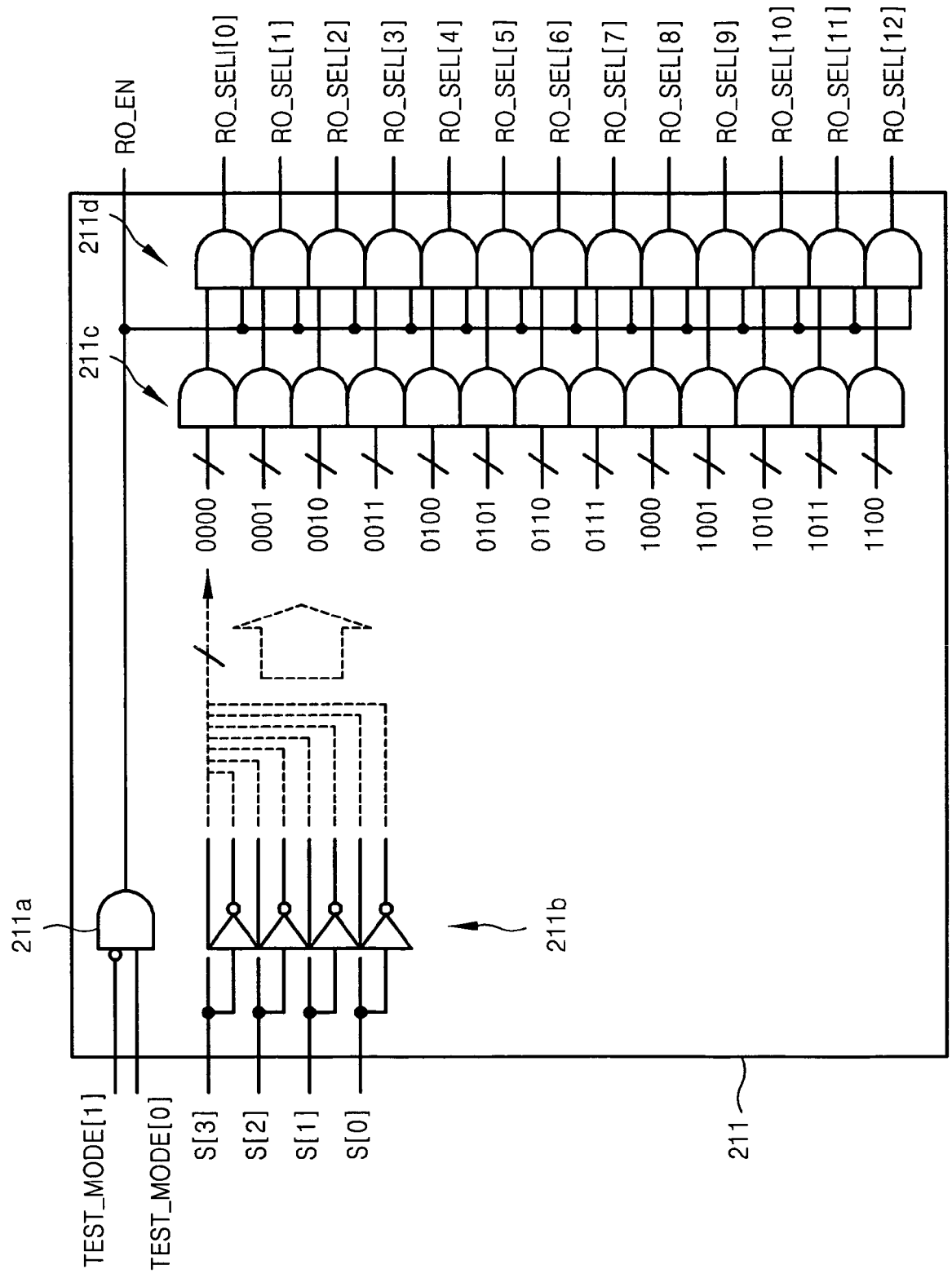
FIG. 2 is a detailed circuit diagram of an encoder according to some embodiments of the present invention as shown in FIG. 1.

FIG. 2 is a detailed circuit diagram of the encoder 211 shown in FIG. 1. The encoder 211 includes a first AND gate 211a, a plurality of inverters 211b, a plurality of second AND gates 211c, and a plurality of third AND gates 211d.

The first AND gate 211a performs an AND operation on the bits of the test mod signal TEST_MODE[1:0] to output a RO_EN signal. In some embodiments of the present invention, a logic high signal is output when the test mode signal TEST_MODE[1:0] is "01". The inverters 211b respectively invert the bit values of the control signal S[3:0].

The second AND gates 211c output a logic high signal for only one of 13 different bit values of the control signal S[3:0]. The third AND gates 211c respectively perform AND operations on the output of the first AND gate 211a and the individual outputs of the respective second AND gates 211b to output a logic high enable signal RO_SEL[12:0] to only one ring oscillator among the plurality of ring oscillators included in the ring oscillation unit 212. As a result, the signal RO_SEL[12:0] is obtained by decoding the control signal S[3:0]. For example, when the control signal S[3:0] is "0000", the signal RO_SEL[0] is provided at a logic high to select the first ring oscillator in the ring oscillation unit 212. Similarly, when the control signal S[3:0] is "0001", the signal RO_SEL[1] is provided at a logic high to select the second ring oscillator in the ring oscillation unit 212. Likewise, when the control signal S[3:0] is "1100", the signal RO_SEL[12] is provided at a logic high to select the last ring oscillator in the ring oscillation unit 212.

Figure 3:
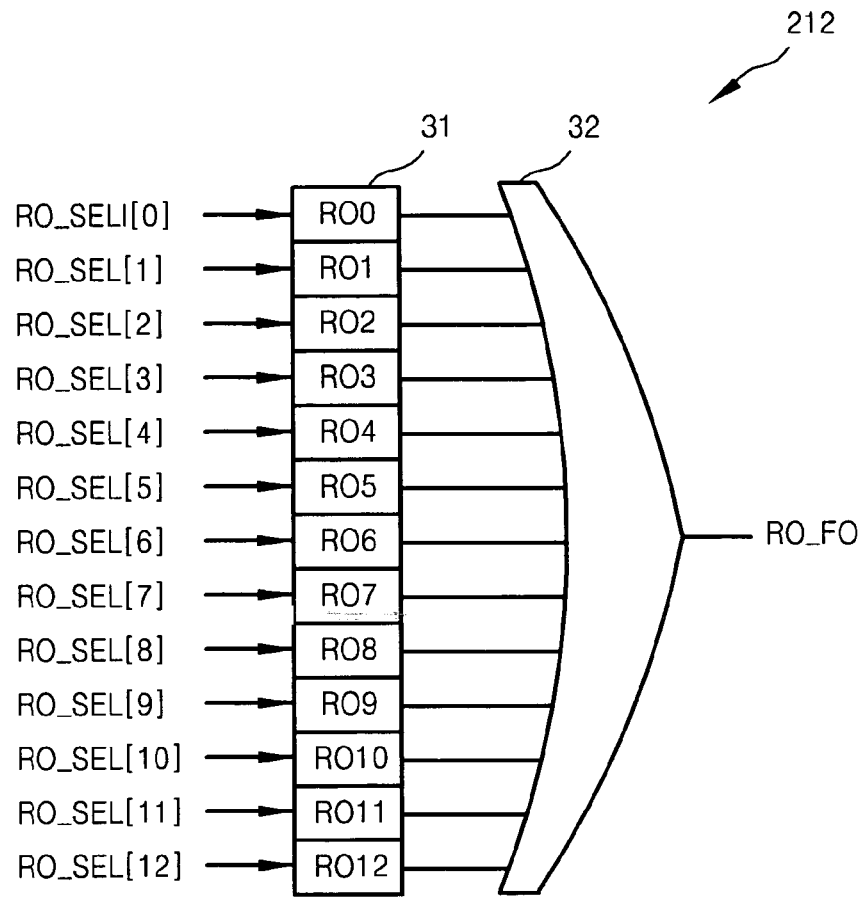
FIG. 3 is a detailed circuit diagram of a ring oscillation unit according to some embodiments of the present invention as shown in FIG. 1.

FIG. 3 is a detailed circuit diagram of the ring oscillation unit 212 shown in FIG. 1. The ring oscillation unit 212 includes a plurality of ring oscillators 31 and an OR gate 32. The ring oscillators 31 are configured to respectively output oscillation signals having different frequencies, and are selected by the signal RO_SEL[12:0]. The OR gate 32 outputs the oscillation signal RO_FO output from an enabled one among the ring oscillators 31.

Table 1 shows examples of the configuration of the ring oscillators 31 shown in FIG. 3.

TABLE 1

| Ring Oscillator | Type | Number of stages | Spacing |
| --- | --- | --- | --- |
| RO0 | Inv | 11 | Minimum metal spacing |
| RO1 | Inv (Cap) | 5 | M1/500 µm |
| RO2 | Inv (Cap) | 5 | M2/500 µm |
| RO3 | Inv (Cap) | 5 | M3500 µm |
| RO4 | Inv (Cap) | 5 | M4/500 µm |
| RO5 | Inv (Cap) | 5 | M5/500 µm |
| RO6 | Inv (Cap) | 5 | M6/500 µm |
| RO7 | Inv (Res) | 5 | M1/1000 µm |
| RO8 | Inv (Res) | 5 | M2/1000 µm |
| RO9 | Inv (Res) | 5 | M3/1000 µm |
| RO10 | Inv (Res) | 5 | M4/1000 µm |
| RO11 | Inv (Res) | 5 | M5/1000 µm |
| RO12 | Inv (Res) | 7 | M6/1000 µm |

Figure 4A:
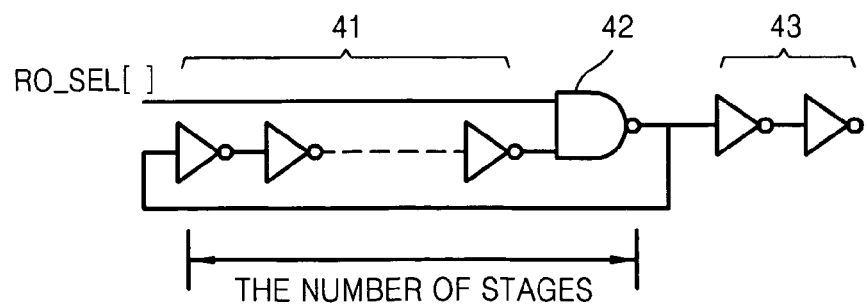
FIG. 4A is an equivalent circuit diagram of a ring oscillator according to some embodiments of the present invention as shown in FIG. 3.
Figure 4B:
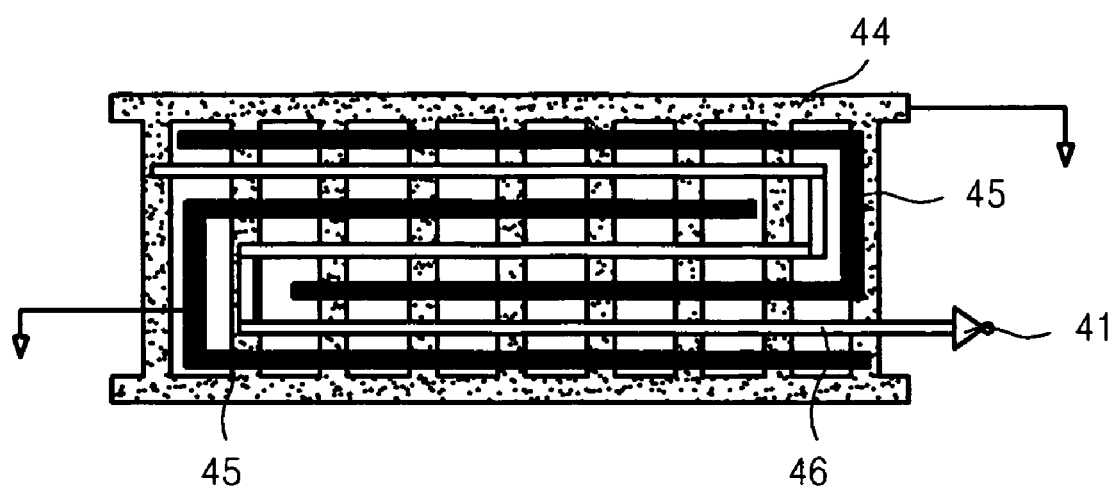
FIG. 4B illustrates a capacitance pattern for a metal layer for use in a ring oscillator according to some embodiments of the present invention.
Figure 4C:
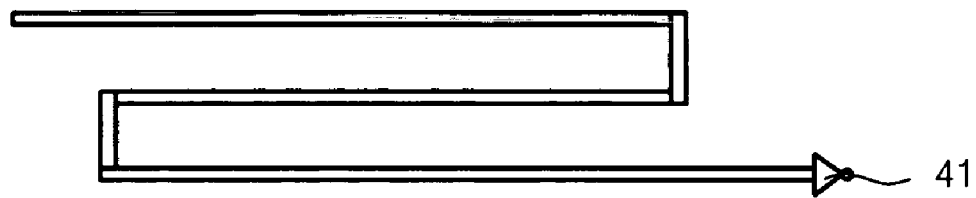
FIG. 4C illustrates a resistance pattern for a metal layer for use in a ring oscillator according to some embodiments of the present invention.

In Table 1, Inv(Cap) indicates a capacitance-type ring oscillator (as shown in FIG. 4B) and Inv(Res) indicates a resistance-type ring oscillator (as shown in FIG. 4C).

FIG. 4A illustrates an equivalent circuit for the ring oscillators 31 shown in FIG. 3. The equivalent circuit includes a plurality of inverters 41 connected in series, a NAND gate 42 receiving a signal RO_SEL[ ] and an output of the last one among the inverters 41 as inputs, and two inverters 43 buffering an oscillation signal output from the NAND gate 42. The first one of the inverters 41 receives an output of the NAND gate 42. The number of stages may be denoted by the sum of the number of inverters 41 and the NAND gate 42.

As shown in Table 1, the ring oscillator RO0 is an inverter oscillator including only inverters (Inv) for detecting the effect of a front end of line (FEOL). Ring oscillators RO1 through RO5 are capacitance type ring oscillators having a capacitance pattern shown in FIG. 4B between inverters 41. Ring oscillators RO6 through RO12 are resistance type ring oscillators having a resistance pattern shown in FIG. 4C between the inverters 41.

In Table 1, M1 through Mn each indicate a metal layer, where M1 is the lowest layer among the metal layers M1 through Mn. For example, the ring oscillator RO1 has 5 stages and a 500 µm-metal line, and has a structure including M1 (500 µm), an inverter 41, M1 (500 µm), an inverter 41; M1 (500 µm), an inverter 41, M1 (500 µm), an inverter 41, M1 (500 µm), and the NAND gate 42 sequentially connected.

FIG. 4B illustrates a capacitance pattern for metal layers in ring oscillators according to some embodiments of the present invention. Reference Numeral 44 denotes an (n−1)-th metal layer, which is grounded. Reference numeral 46 denotes an n-th metal layer positioned above the (n−1)-th metal layer 44. Reference numeral 45 is a metal layer that surrounds the line 46 and is grounded.

FIG. 4C illustrates a resistance pattern for metal layers in ring oscillators according to some embodiments of the present invention. The capacitance pattern shown in FIG. 4B and the resistance pattern shown in FIG. 4C have a layout using a minimum width/space design rule for each line. In FIG. 4C, the spacing between stages is 5 µm.

Referring again to FIG. 4A, the NAND gate 42 enables or disables the ring oscillator according to the signal RO_SEL[ ]. When the signal RO_SEL[ ] is at a logic high, the NAND gate 42 acts like an inverter, thereby enabling the ring oscillator and outputting an oscillation signal. When the signal RO_SEL[ ] is at a logic low, the NAND gate 42 disables the ring oscillator regardless of the input received through the other terminal. The inverters 43 buffer the output of the NAND gate 42, thereby buffering changes in the ring oscillation signal due to a load (not shown) connected to the inverters 43.

Figure 5:
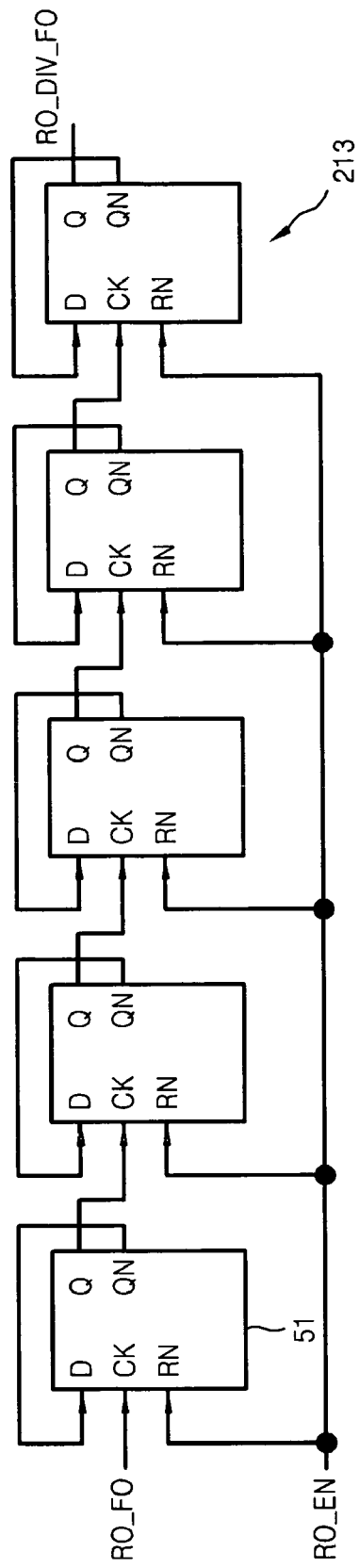
FIG. 5 is a detailed circuit diagram of a voltage divider according to some embodiments of the present invention as shown in FIG. 1.

FIG. 5 is a detailed circuit diagram of the voltage divider 213 shown in FIG. 1. The voltage divider 213 includes a plurality of D flip-flops 51. Each of the D flip-flops 51 receives the oscillation signal RO_FO output from the ring oscillation unit 212 through a clock terminal CK and the signal RO_EN output from the encoder 211 through a reset terminal RN and divides the oscillation signal RO_FO, thereby outputting the signal RO_DIV_FO. In some embodiments of the present invention, the D flip-flops 51 are provided in five stages, to thereby divide a signal by a factor of 32. However, the number of stages may be adjusted according to the resolution of the apparatus. Since the voltage of a high-frequency ring oscillation signal is divided regardless of the characteristics of the apparatus, delay measurement is possible even when the apparatus operates at a relatively low speed.

Figure 6:
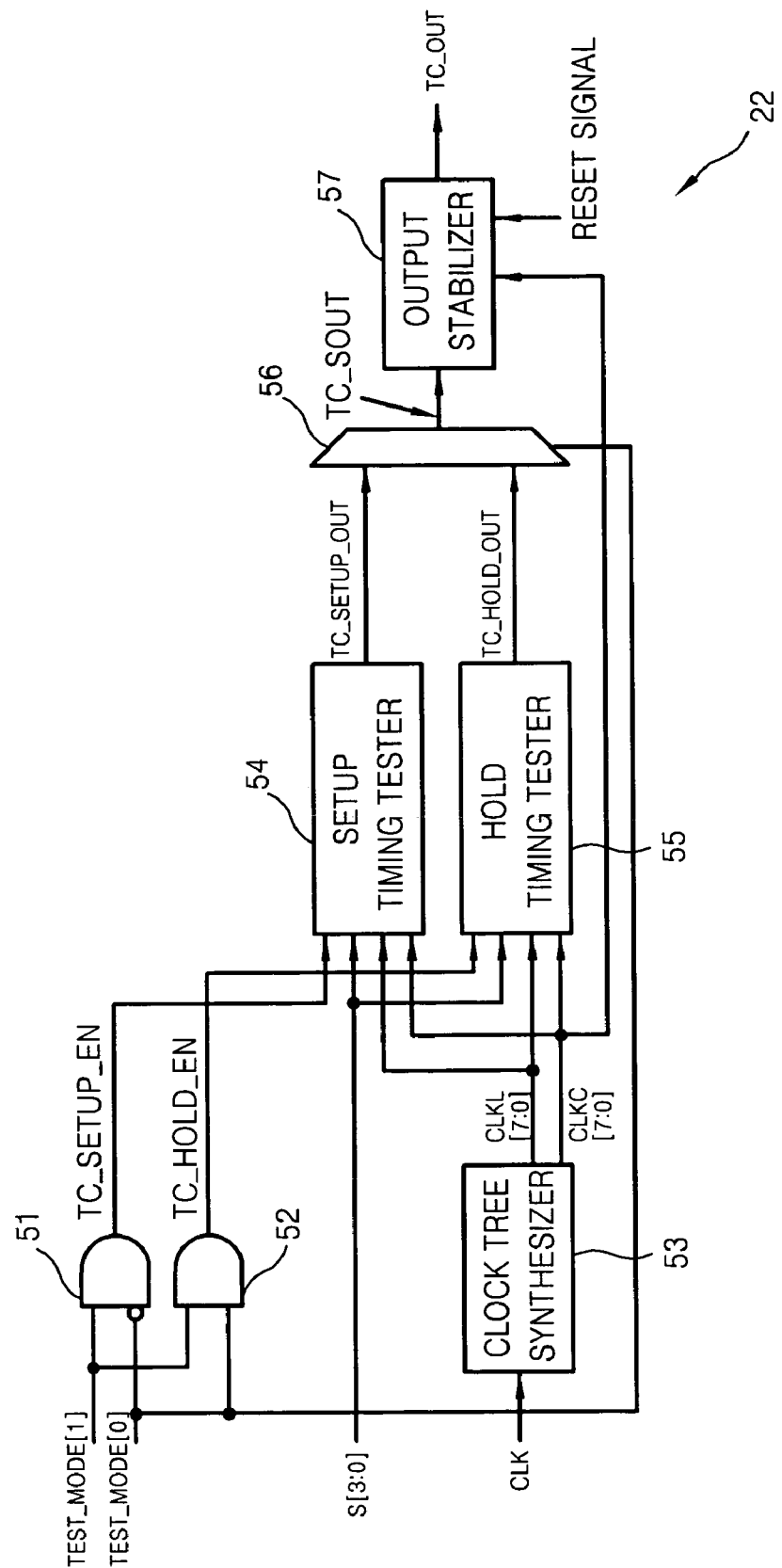
FIG. 6 is a detailed block diagram of a timing test unit according to some embodiments of the present invention as shown in FIG. 1.

FIG. 6 is a detailed block diagram of the timing test unit 22 shown in FIG. 1. The timing test unit 22 includes a first AND gate 51, a second AND gate 52, a clock tree synthesizer 53, a setup timing tester 54, a hold timing tester 55, and a selector 56. In addition, the timing test unit 22 may further include an output stabilizer 57 to stabilize a signal output from the selector 56.

The first AND gate 51 performs an AND operation on a signal TEST_MODE[1] and an inverted signal of a signal TEST_MODE[0], and thereby outputs an enable signal TC_SETUP_EN for testing a setup timing margin. The second AND gate 52 performs the AND operation on the signal TEST_MODE[1] and the signal TEST_MODE[0], and outputs an enable signal TC_HOLD_EN for testing a hold timing margin. The clock tree synthesizer 53 generates signals CLKL[7:0] and CLKC[7:0] from an input clock signal CLK to provide clock tree synthesis.

Figure 7:
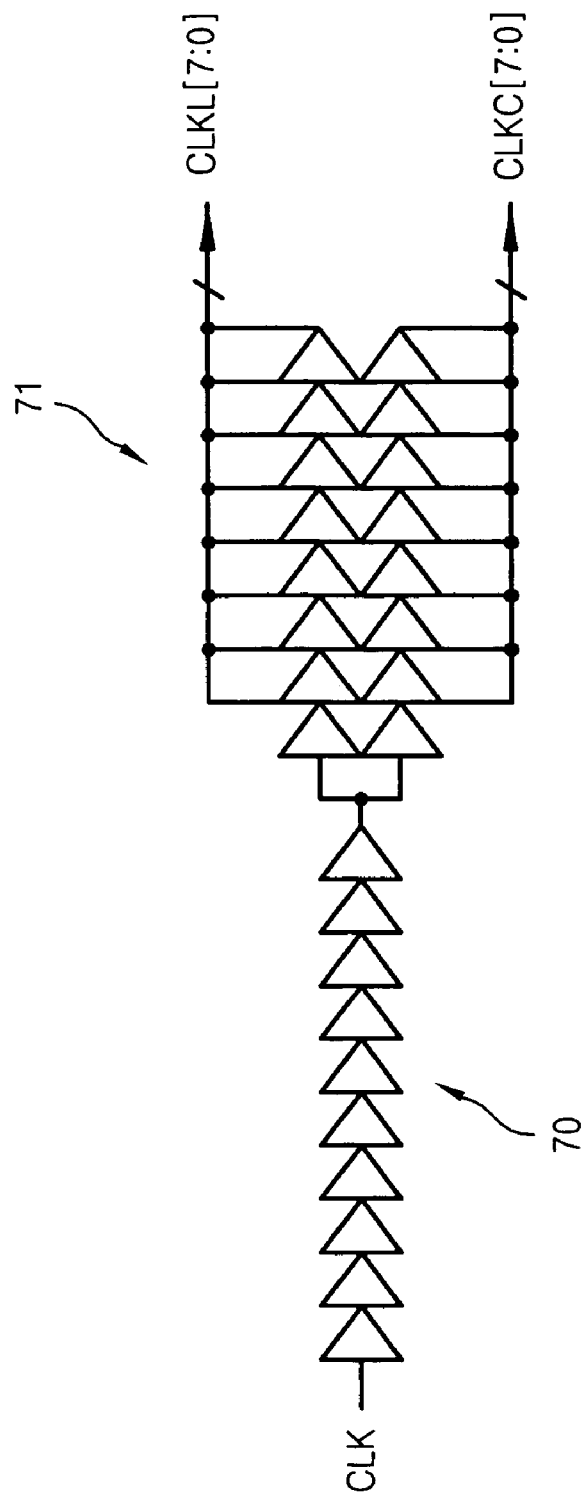
FIG. 7 is a detailed circuit diagram of a clock tree synthesizer according to some embodiments of the present invention as shown in FIG. 6.

FIG. 7 is a detailed circuit diagram of the clock tree synthesizer 53 according to some embodiments of the present invention as shown in FIG. 6. Referring to FIG. 7, the input clock signal CLK is buffered by a saturation logic section 70 including 10 clock buffers, so that the transition time of the input clock signal CLK is saturated. As a result, clock tree signals having a constant transition time may be output regardless of the transition time of the input clock signal CLK. A clock tree section 71 includes two branches each of which includes 8 clock buffers, to thereby delay and output the signals CLKL[7:0] and CLKC[7:0] (each of which includes a set of 8 clock signals).

Figure 8:
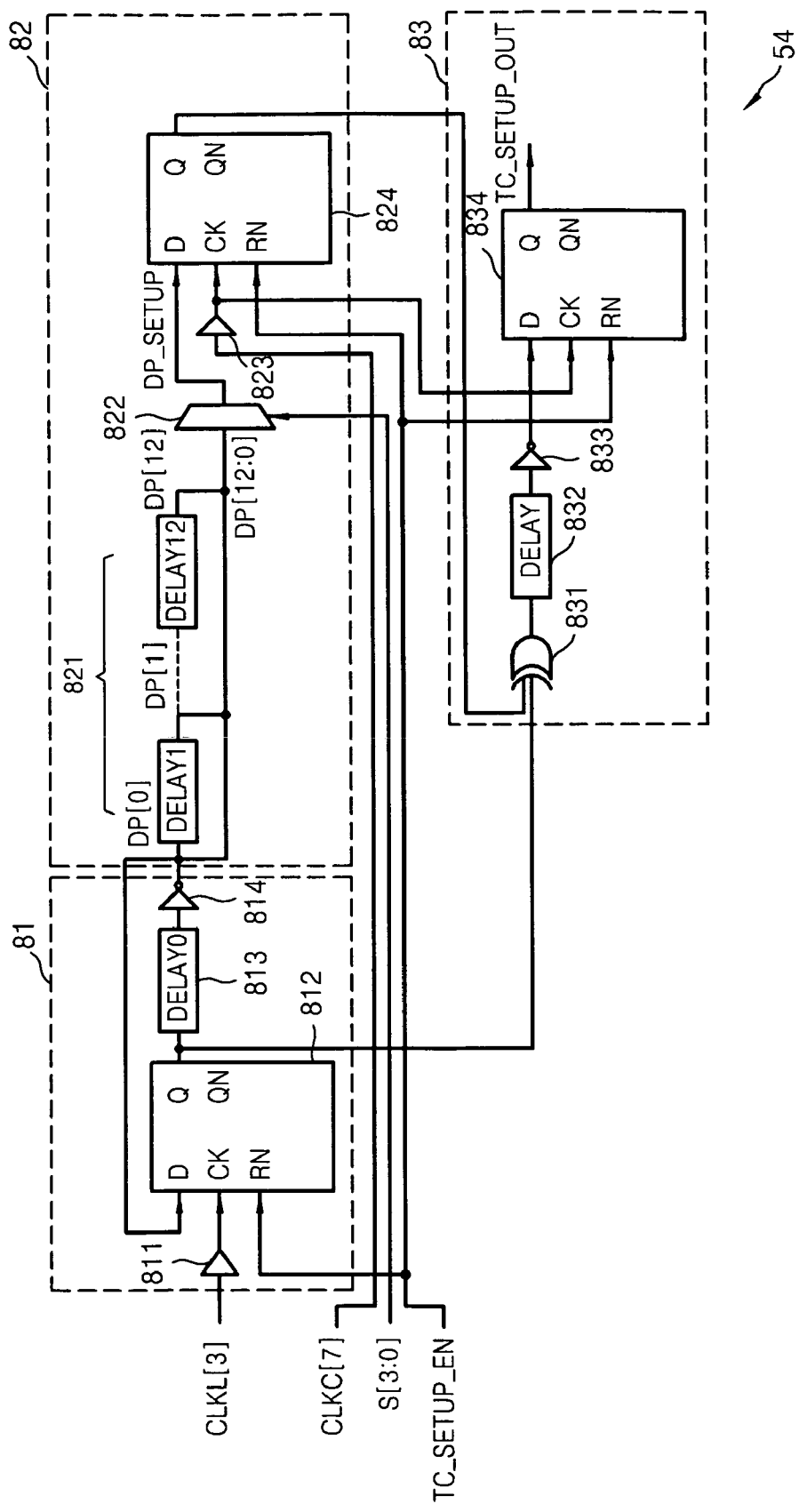
FIG. 8 is a detailed circuit diagram of a setup timing tester according to some embodiments of the present invention as shown in FIG. 6.

FIG. 8 is a detailed circuit diagram of the setup timing tester 54 shown in FIG. 6. The setup timing tester 54 includes a clock sync oscillator 81, a pulse generator 82, and a time violation tester 83.

The clock sync oscillator 81 outputs an oscillation signal in synchronization with a clock signal CLKL[3] corresponding to a center of the signal CLKL[7:0]. Accordingly, the setup timing tester 54 can automatically generate a signal and test the timing margin without the input of a particular external data signal. Also, the setup timing tester 54 can test the timing margin regardless of a rising edge or falling edge of a clock signal. The pulse generator 82 outputs pulses by delaying the oscillation signal output from the clock sync oscillator 81 by a predetermined time according to the control signal S[3:0]. The time violation tester 83 detects the violation of a setup time when the period of the signal CLKL[3] is greater than a data path delay.

The clock sync oscillator 81 includes a clock buffer 811, a D flip-flop 812, a delay0 813, and an inverter 814. The clock buffer 811 buffers the signal CLKL[3] to stabilize and output the signal CLKL[3] to a clock terminal CK of the D flip-flop 812. The D flip-flop 812 receives the signal TC_SETUP_EN shown in FIG. 6 through a reset terminal RN. An output terminal Q of the D flip-flop 812 is connected to a data input terminal D thereof through the delay0 813 and the inverter 814 and outputs the oscillation signal in synchronization with the clock signal CLKL[3].

The pulse generator 82 includes a delay group 821 of delay1 through delay12, a selector 822, a clock buffer 823, and a D flip-flop 824. The delay1 through delay12 in the delay group 821 are connected in series to sequentially delay the oscillation signal output from the clock sync oscillator 81. The selector 822 selects and outputs, as a data path delay DP_SETUP, one of the signals respectively output from the delay1 through delay 12 according to the control signal S[3:0] serving as a selection signal. The selection signal S[3:0] sequentially increases from "0000" to "1100". According to this increasing selection signal S[3:0], the data path delay DP_SETUP output from the selector 822 also increases.

The signal CLKC[7] is input to a clock terminal CK of the D flip-flop 824 through the clock buffer 823. The D flip-flop 824 receives the signal TC_SETUP_EN through a reset terminal RN and the data path delay DP_SETUP through a data input terminal D and outputs a signal in synchronization with a clock signal output from the clock buffer 823.

The time violation tester 83 includes an exclusive OR gate 831, a delay unit 832, an inverter 833, and a D flip-flop 834. The exclusive OR gate 831 performs an exclusive OR operation on the signal output from the D flop-flop 812 included in the clock sync oscillator 81 and the signal output from the D flip-flop 824 included in the pulse generator 82. The inverter 833 inverts the result of the exclusive OR operation so that a logic high signal is output when the inputs to the exclusive OR are the same, to allow for indication of the occurrence or non-occurrence of a setup time violation corresponding to the moment the data path delay DP_SETUP becomes greater than the period of the clock signal CLKL[3]. In other words, a setup time violation occurs when the signal output from the D flip-flop 812 included in the clock sync oscillator 81 is different from the signal output from the D flip-flop 824 included in the pulse generator 82. To indicate that the setup time violation has occurred, the inverter 833 outputs a logic low signal.

The delay unit 832 delays the output of the exclusive OR gate 831 to prevent hold time violation in logic that captures the output of the exclusive OR gate 831. The inverter 833 inverts the output of the delay unit 832. In some embodiments of the present invention, the D flip-flop 834 latches the output of the inverter 833 to thereby output a signal TC_SETUP_OUT. The D flip-flop 834 is provided to prevent errors from occurring due to the output of the inverter 833.

Figure 9:
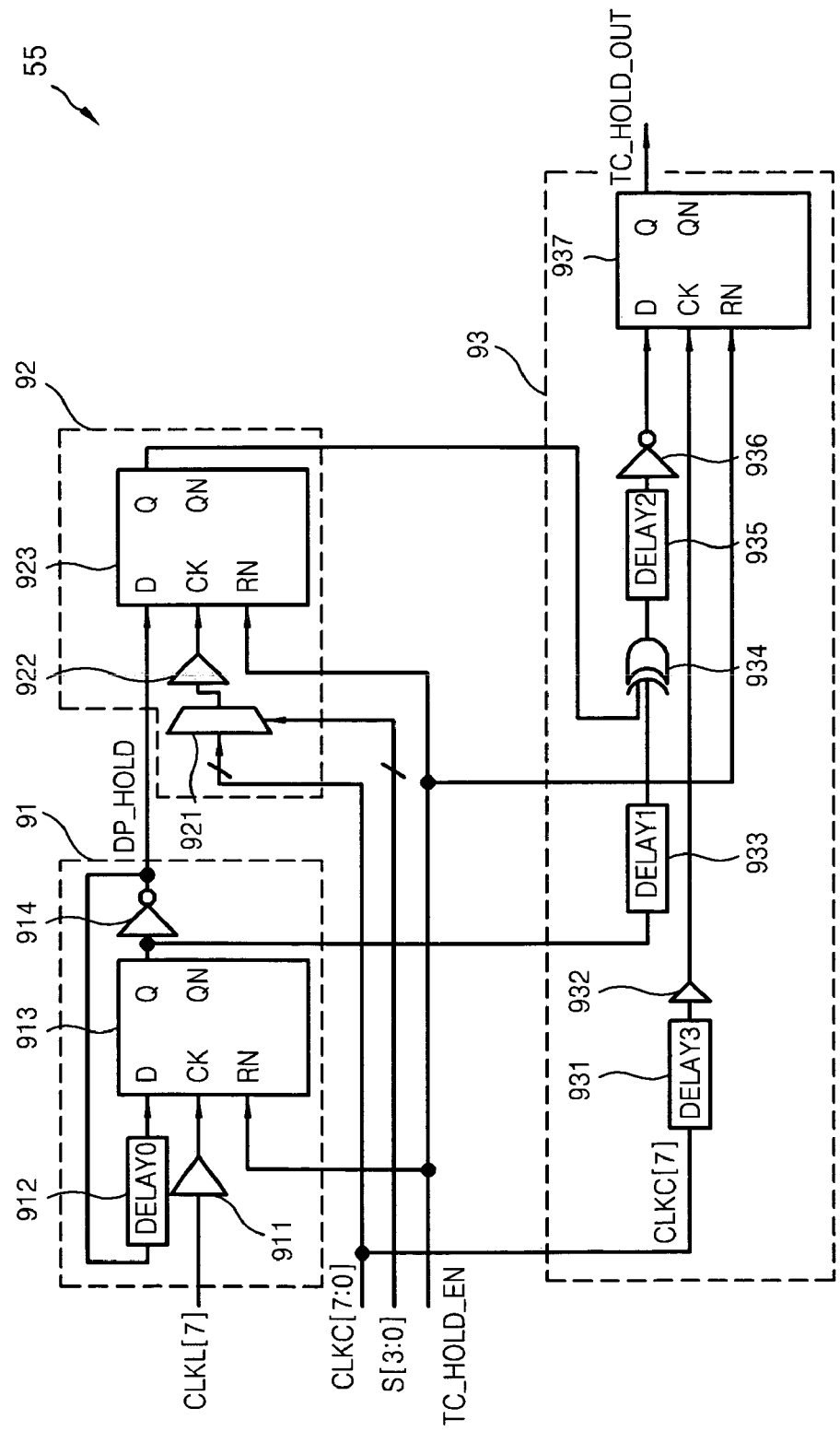
FIG. 9 is a detailed circuit diagram of a hold timing tester according to some embodiments of the present invention as shown in FIG. 6.

FIG. 9 is a detailed circuit diagram of the hold timing tester 55 shown in FIG. 6. The hold timing tester 55 includes a clock sync oscillator 91, a pulse generator 92, and a time violation tester 93.

The clock sync oscillator 91 outputs an oscillation signal in synchronization with the signal CLKL[7]. Accordingly, the hold timing tester 55 can automatically generate a signal and test the timing margin without the input of a particular external data signal. The pulse generator 92 receives the oscillation signal and generates a pulse in synchronization with a clock signal among the signals CLKC[7:0] that is selected according to the control signal S[3:0]. The time violation tester 93 detects occurrence or non-occurrence of the hold time violation based on the arrival time of the selected clock signal.

The clock sync oscillator 91 includes a clock buffer 911, a delay0 912, a D flip-flop 913, and an inverter 914. The clock buffer 911 buffers the signal CLKL[7] to stabilize and output the signal CLKL[7] to a clock terminal CK of the D flip-flop 913. The D flip-flop 913 receives the signal TC_HOLD_EN shown in FIG. 6 through a reset terminal RN. An output terminal Q of the D flip-flop 913 is connected to a data input terminal D thereof through the inverter 914 and the delay0 912 and outputs the oscillation signal in synchronization with the clock signal CLKL[7].

The pulse generator 92 includes a selector 921, a clock buffer 922, and a D flip-flop 923. The selector 921 selects one of the clock signals CLKC[7:0] according to the selection signal S[3:0], thereby selecting one clock among a plurality of clocks having various latencies. In other words, when the selection signal S[3:0] is sequentially increased from "0000" to "0111", the clock signals CLKC[7:0] are sequentially selected. Accordingly, a time taken for the selected clock signal to reach a clock terminal CK of the D flip-flop 923 through the clock buffer 942 may also increase, and thus the D flip-flop 923 may not correctly capture the oscillation signal. As a result, a hold time violation may occur.

The time violation tester 93 includes a clock buffer 932, an exclusive OR gate 934, a delay1 933, a delay2 935, a delay3 931, an inverter 936, and a D flip-flop 937. The exclusive OR gate 934 and the inverter 936 operate to output a logic high signal to indicate the successful pass of the hold timing test when the output signal of the D flip-flop 923 included in the pulse generator 92 is the same as a signal obtained by delaying the output signal of the D flip-flop 913 included in the clock sync oscillator 91 by a predetermined time using the delay1 933.

The delay2 935 delays the output of the exclusive OR gate 934 to prevent hold time violation in logic that captures the output of the exclusive OR gate 934. The inverter 936 inverts the output of the delay2 935.

In some embodiments of the present invention, to prevent errors from occurring due to the output of the inverter 936, a D flip-flop 937 is provided that receives the clock signal CLKC[7] after being delayed by the delay3 931 and buffered by the clock buffer 932, and latches the output of the inverter 936 to output a signal TC_HOLD_OUT.

Figure 10:
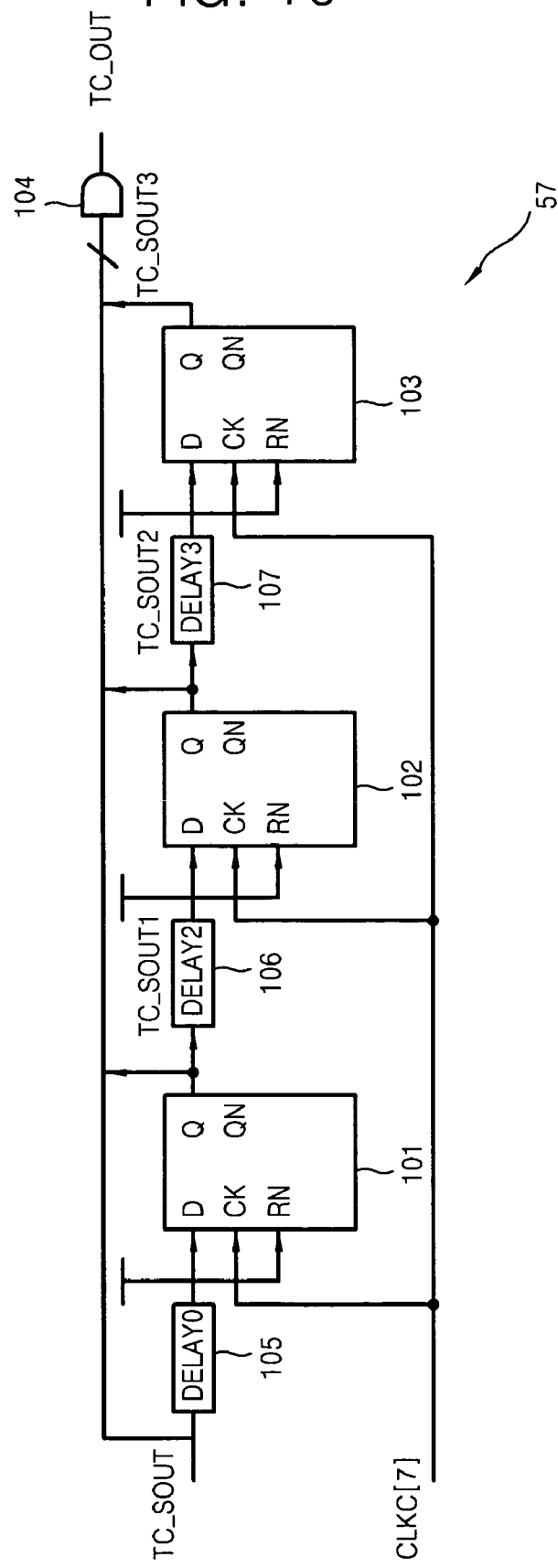
FIG. 10 is a detailed circuit diagram of an output stabilizer according to some embodiments of the present invention as shown in FIG. 6.

FIG. 10 is a detailed circuit diagram of the output stabilizer 57 shown in FIG. 6. The output stabilizer 57 includes a plurality of D flip-flops 101, 102, and 103 and an AND gate 104 configured to perform an AND operation on output signals of the D flip-flops 101, 102, and 103. The D flip-flops 101, 102, and 103 are connected in series and have a shift register structure. The D flip-flop 101 receives an output signal TC_SOUT of the selector 56. In addition, each of the D flip-flops 101, 102, and 103 receives the clock signal CLKC[7] through a clock terminal CK and a reset signal from an outside source through a reset terminal RN. To prevent hold time violations, a delay1 105, a delay2 106, and a delay3 107 are respectively provided at input terminals D of the D flip-flops 101, 102, and 103. Delay values of the delay1 105, the delay2 106, and/or the delay3 107 may be determined according to operating conditions, and may be the same in some embodiments.

The AND gate 104 performs an AND operation on outputs TC_SOUT1, TC_SOUT2, and TC_SOUT3 of the respective D flip-flops 101, 102, and 103, to thereby output a stable logic high when a setup or hold time is not violated and a stable logic low when the setup or hold time is violated.

FIG. 11(a) through 11(d) illustrate the results of simulations under worst-case operating conditions in a 0.13 μm-generic process. For example, the worst-case operating conditions may include an environment having all NMOS/PMOS devices in a relatively slow state, an operating voltage of 1.05 V, and a temperature of 125° C.

Figure 11:
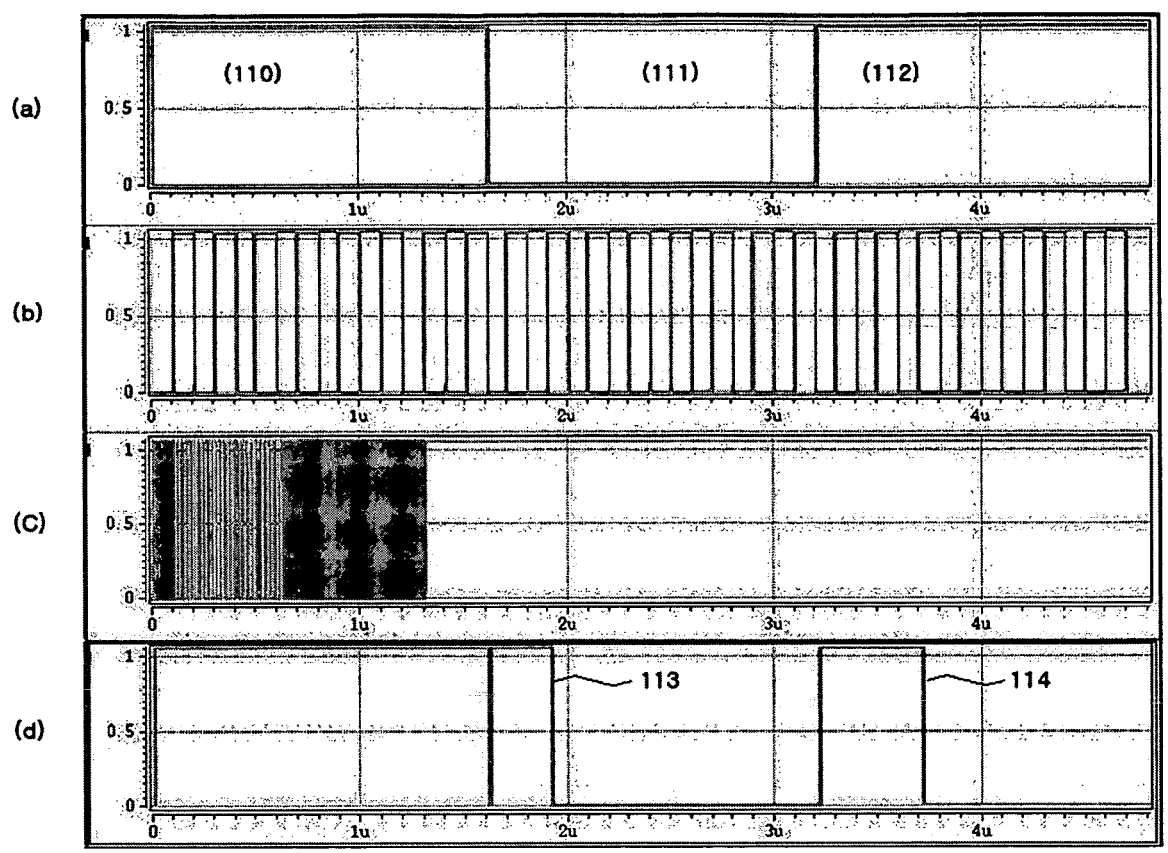
FIG. 11 illustrates results of simulations under the worst-case operating conditions in a 0.13 μm process according to some embodiments of the present invention.

Referring to FIG. 11(a), simulations were performed in a delay measuring mode 110 using a ring oscillator, a setup timing margin test mode 111, and a hold timing margin test mode 112. Referring to FIG. 11(b), the control signal S[3:0] changes from "0000" to "1100" when the modes 110, 111, and 112 are sequentially performed.

FIG. 11(c) illustrates a ring oscillation signal output from the ring oscillation unit 212 shown in FIG. 1. The ring oscillation signal is generated when the control signal S[3:0] changes from "0000" to "1100". Table 2 shows the result of a simulation performed using a transistor-level simulation program HSPICE when the test mode is the delay measuring mode 110.

TABLE 2

| S[3:0] | Output (MHz) | | |
|---|---|---|---|
| | Worst | Normal | Best |
| 0000 | 25.209688 | 42.551563 | 68.134375 |
| 0001 | 1.747563 | 2.991938 | 4.924063 |
| 0010 | 1.768719 | 3.047766 | 5.076563 |
| 0011 | 1.762125 | 3.078469 | 5.070156 |
| 0100 | 1.783813 | 3.086188 | 5.039063 |

TABLE 2-continued

| S[3:0] | Output (MHz) | | |
|---|---|---|---|
| | Worst | Normal | Best |
| 0101 | 1.776375 | 3.073422 | 5.046875 |
| 0110 | 2.349250 | 4.014375 | 6.436719 |
| 0111 | 7.697188 | 13.200313 | 22.186406 |
| 1000 | 7.724219 | 13.876094 | 22.605313 |
| 1001 | 11.255938 | 20.616563 | 36.623438 |
| 1010 | 11.920469 | 22.445938 | 32.692188 |
| 1011 | 11.310938 | 24.145781 | 17.717813 |
| 1100 | 25.785469 | 43.329688 | 75.607813 |

Table 2 shows oscillation frequencies output under worst, normal, and best conditions when the signal S[3:0] changes. Referring to Table 2, the matching of delay and capacitance/resistance can be measured with respect to 13 ring oscillation patterns in the delay measuring mode. In other words, the period of an oscillation frequency can be obtained by taking the reciprocal of the oscillation frequency, and an on-chip delay can be detected by comparing a period measured on an actual chip with a period output in a simulation.

FIG. 11(d) illustrates the signal TC_OUT generated in a timing margin test when the input clock frequency was 200 MHz. In the timing margin test, when the signal S[3:0] was increased from "0000", the moment the signal TC_OUT transited to a logic low, that is, the moment timing violation occurred was detected. In the setup timing margin test mode, a setup timing margin between about 100 MHz and about 250 MHz was tested under worst-case operating conditions. In the hold timing margin test mode, a hold timing margin was tested regardless of the system operating frequency. Referring to FIG. 11(d), when the input clock frequency is lower than 200 MHz, the signal TC_OUT is at a logic high while the signal S[3:0] changes from "0000" to "0010".

Tables 3 and 4 respectively show setup timing margins and hold timing margins measured using a gate-level simulation program, Static Timing Analysis (STA).

TABLE 3

| S[3:0] | Output (logic high/logic low) Operating frequency (MHz) | | |
|---|---|---|---|
| | Worst | Normal | Best |
| 0000 | 255.39 | 411.46 | 681.49 |
| 0001 | 240.30 | 398.85 | 672.43 |
| 0010 | 213.62 | 349.88 | 586.21 |
| 0011 | 189.47 | 310.11 | 518.26 |
| 0100 | 169.91 | 278.11 | 463.56 |
| 0101 | 154.11 | 252.14 | 419.32 |
| 0110 | 141.64 | 231.64 | 383.08 |
| 0111 | 130.59 | 213.49 | 353.65 |
| 1000 | 121.74 | 198.98 | 329.15 |
| 1001 | 113.42 | 185.34 | 306.26 |
| 1010 | 106.53 | 174.03 | 287.04 |
| 1011 | 100.30 | 164.81 | 270.16 |
| 1100 | 95.35 | 155.71 | 256.80 |

Referring to Table 3, under the worst-case operating conditions, the signal TC_OUT was at the logic high when the input clock frequency was lower than 255.39, 240.30, and 213.62 MHz at the signals S[3:0] of "0000", "0001", and "0010", respectively. When the signal S[3:0] was "0011" and the input clock frequency was higher than 189.47 MHz, the signal TC_OUT was at the logic low according to the simulation results. This is confirmed by result 113 as shown in FIG. 11(d). According, if an actual semiconductor device operates when the signal S[3:0] is "0011" and the input clock frequency is 200 MHz, it can be inferred that there is an operating margin corresponding to a difference between 200 MHz and 189.47 MHz.

TABLE 4

| S[3:0] | Output (logic high/logic low) Operating margin (ns) | | |
|---|---|---|---|
| | Worst | Normal | Best |
| 0000 | 0.695 | 0.452 | 0.289 |
| 0001 | 0.512 | 0.338 | 0.219 |
| 0010 | 0.330 | 0.225 | 0.150 |
| 0011 | 0.133 | 0.103 | 0.076 |
| 0100 | −0.059 | −0.015 | 0.005 |
| 0101 | −2.251 | −0.134 | −0.068 |
| 0110 | −0.440 | −0.250 | −0.139 |
| 0111 | −0.817 | −0.484 | −0.279 |

Referring to Table 4, a semiconductor device may operate only when an operating margin has a positive value and, may not operate when the operating margin has a negative value. In other words, when the operating margin has a negative value, the margin is not sufficient. For example, when the signal S[3:0] is "0100", the operating margin is −0.059 ns, and therefore, a margin is deficient at the gate level. However, referring to result 114 shown in FIG. 11(d), the signal TC_OUT is at the logic high. This means that the semiconductor device may operate in a transistor-level simulation but may not operate in a gate-level simulation. This situation may be caused by a simulation margin that appears in the result of the gate-level simulation due to gate-level abstraction.

According to some embodiments of the present invention, an on-chip delay and a timing margin can be measured reflecting the state of a silicon main chip when an application-specific integrated circuit (ASIC) and/or a system on chip (SOC) are designed. When the on-chip delay and the timing margin are measured, more accurate process management and/or more effective analysis of silicon failures may become possible in the design of semiconductor integrated circuits.

While the present invention has been shown and described with reference to exemplary embodiments thereof, it will be understood by those of ordinary skill in the art that various changes in form and detail may be made herein without departing from the spirit and scope of the present invention, as defined by the following claims.

That which is claimed:

1. An apparatus for measuring on-chip characteristics in a semiconductor circuit, the apparatus comprising:
    an oscillation unit configured to selectively output a first oscillation signal responsive to a first control signal;
    a timing test unit configured to generate a second oscillation signal using an input clock signal, generate a pulse from the second oscillation signal responsive to a second control signal, and provide an output indicating whether an operating time violation has occurred based on a comparison of the second oscillation signal and the pulse; and
    a selection unit configured to select one of the output of the oscillation unit and the output of the timing test unit responsive to a test mode signal,
    wherein the apparatus is configured to measure an on-chip delay using a period of the first oscillation signal and/or to measure a timing margin of the semiconductor circuit using the output of the timing test unit based on an output of the selection unit.

2. The apparatus of claim 1, wherein the oscillation unit comprises:
    an encoder comprising a plurality of signal output sections, wherein the encoder is configured to encode the first control signal, select one of the plurality of signal output sections, and output a selection signal through the selected one of the plurality of signal output sections;
    a ring oscillation unit comprising a plurality of oscillators, wherein the ring oscillation unit is configured to selectively enable one of the plurality of oscillators to output a third oscillation signal based on the selection signal; and
    a voltage divider configured to divide the third oscillation signal by a predetermined ratio and output a result of the division as the first oscillation signal.

3. The apparatus of claim 2, wherein each of the oscillators comprises:
    a plurality of inverters connected in series; and
    a NAND gate configured to receive the selection signal and an output of a last one of the plurality of inverters,
    wherein an output of the NAND gate is input to a first one of the plurality of inverters.

4. The apparatus of claim 3, wherein at least one of the plurality of oscillators comprises a plurality of metal lines disposed such that a predetermined capacitance and/or resistance is present between the plurality of inverters and/or between the plurality of inverters and the NAND gate.

5. The apparatus of claim 1, wherein the timing test unit comprises:
    a clock tree synthesizer configured to synthesize a clock tree from the input clock signal and output a first clock set and a second clock set respectively comprising a plurality of sequential clock signals; and
    a setup timing tester configured to generate the second oscillation signal using a first clock signal of the first clock set, delay the second oscillation signal responsive to the second control signal, generate the pulse using a clock signal of the second clock set in response to the delayed second oscillation signal, and determine whether a setup time violation has occurred based on a comparison of the second oscillation signal and the pulse.

6. The apparatus of claim 1, wherein the timing test unit comprises:
    a clock tree synthesizer configured to synthesize a clock tree from the input clock signal and output a first clock set and a second clock set respectively comprising a plurality of sequential clock signals; and
    a hold timing tester configured to generate the second oscillation signal using a second clock signal of the first clock set, delay the clock signals of the second clock set responsive to the second control signal, receive the second oscillation signal and generate the pulse using the delayed clock signals of the second clock set, and determine whether a hold time violation has occurred based on a comparison of the second oscillation signal and the pulse.

7. The apparatus of claim 1, wherein the timing test unit comprises:
    a clock tree synthesizer configured to synthesize a clock tree from the input clock signal and output a first clock set and a second clock set respectively comprising a plurality of sequential clock signals;
    a setup timing tester configured to generate the second oscillation signal using a first clock signal of the first clock set, delay the second oscillation signal responsive to the second control signal, generate the pulse using a clock signal of the second clock set in response to the delayed second oscillation signal, and determine whether a setup time violation has occurred based on a comparison of the second oscillation signal and the pulse;

a hold timing tester configured to generate the second oscillation signal using a second clock signal of the first clock set, delay the clock signals of the second clock set responsive to the second control signal, receive the second oscillation signal and generate the pulse using the delayed clock signals of the second clock set, and determine whether hold time violation has occurred based on a comparison of the second oscillation signal and the pulse; and a selector configured to selectively output an output of the setup timing tester or an output of the hold timing tester based on a test selection signal.

8. The apparatus of claim 5, wherein the clock tree synthesizer comprises:

a saturation logic section comprising a plurality of clock buffers connected in series, wherein the saturation logic section is configured to saturate a transition time of the input clock signal using the plurality of clock buffers; and a clock tree section comprising at least two branches respectively including a plurality of clock buffers, wherein the clock tree section is configured to buffer a clock signal output from the saturation logic section to output the first clock set and the second clock set.

9. The apparatus of claim 5, wherein the setup timing tester comprises:

a clock sync oscillator configured to output the second oscillation signal in synchronization with the first clock signal;

a pulse generator configured to delay the second oscillation signal responsive to the second control signal and output the pulse responsive to a clock signal of the second clock set; and a time violation tester configured to determine whether the second oscillation signal has a same value as the pulse and indicate that a setup time violation has occurred when the second oscillation signal does not have the same value as the pulse.

10. The apparatus of claim 9, wherein the clock sync oscillator comprises:

a first D flip-flop configured to latch the second oscillation signal in synchronization with the first clock signal; and an inverter configured to invert an output of the first D flip-flop and output the inverted output of the first D flip-flop as the second oscillation signal.

11. The apparatus of claim 10, wherein the pulse generator comprises:

a plurality of delay units connected in series and respectively configured to delay the second oscillation signal;

a selector configured to receive a plurality of outputs respectively corresponding to the plurality of delay units and select and output one of the plurality of outputs responsive to the second control signal; and a second D flip-flop configured to latch an output of the selector in synchronization with a last clock signal of the second clock set.

12. The apparatus of claim 11, wherein the time violation tester comprises:

an exclusive OR gate configured to receive the output of the first D flip-flop and an output of the second D flip-flop and indicate whether the output of the first D flip-flop is synchronized with the output of the second D flip-flop.

13. The apparatus of claim 12, wherein the time violation tester further comprises:

an inverter configured to invert an output of the exclusive OR gate; and a third D flip-flop configured to latch an output of the inverter in synchronization with a last clock signal of the second clock set.

14. The apparatus of claim 6, wherein the hold timing tester comprises:

a clock sync oscillator configured to output the second oscillation signal in synchronization with the second clock signal of the first clock set;

a pulse generator configured to delay the plurality of clock signals of the second clock set responsive to the second control signal, receive the second oscillation signal, and generate the pulse using the delayed plurality of clock signals of the second clock set; and a time violation tester configured to determine whether the second oscillation signal has a same value as the pulse and indicate that a hold time violation has occurred when the second oscillation signal does not have the same value as the pulse.

15. The apparatus of claim 14, wherein the clock sync oscillator comprises:

a first D flip-flop configured to latch the second oscillation signal in synchronization with the second clock signal of the first clock set; and an inverter configured to invert an output of the first D flip-flop and output the inverted output of the first D flip-flop as the second oscillation signal.

16. The apparatus of claim 10, wherein the pulse generator comprises:

a selector configured to receive the plurality of clock signals of the second clock set and select one of the plurality of clock signals of the second clock set responsive to the second control signal; and a second D flip-flop configured to latch the second oscillation signal in synchronization with the selected one of the plurality of clock signals output from the selector to thereby generate the pulse.

17. The apparatus of claim 16, wherein the time violation tester comprises:

an exclusive OR gate configured to receive the output of the first D flip-flop and an output of the second D flip-flop and indicate whether the output of the first D flip-flop is synchronized with an output of the second D flip-flop.

18. The apparatus of claim 17, wherein the time violation tester further comprises:

an inverter configured to invert an output of the exclusive OR gate; and a third D flip-flop configured to latch an output of the inverter in synchronization with a last clock signal of the second clock set.

19. The apparatus of claim 7, wherein the timing test unit further comprises:

an output stabilizer configured to stabilize the output of the selector.

20. The apparatus of claim 19, wherein the output stabilizer comprises:

a plurality of D flip-flops respectively configured to shift the output of the selector to a next one of the plurality of D flip-flops in synchronization with a last clock signal of the second clock set; and an AND gate configured to perform an AND operation on outputs of the plurality of D flip-flops and the output of the selector and output a result of the AND operation.

21. An apparatus for measuring a timing margin in a semiconductor circuit, the apparatus comprising:
- a clock tree synthesizer configured to synthesize a clock tree from an input clock signal and output a first clock set and a second clock set respectively comprising a plurality of sequential clock signals;
- a setup timing tester configured to generate a first oscillation signal using a first clock signal of the first clock set, delay the first oscillation signal responsive to a control signal, generate a first pulse using a clock signal of the second clock set in response to the delayed first oscillation signal, and determine whether a setup time violation has occurred based on a comparison of the first oscillation signal and the first pulse;
- a hold timing tester configured to generate a second oscillation signal using a second clock signal of the first clock set, delay the plurality of clock signals of the second clock set responsive to the control signal, receive the second oscillation signal and generate a second pulse using the delayed plurality of clock signals of the second clock set, and determine whether a hold time violation has occurred based on a comparison of the second oscillation signal and the second pulse; and
- a selector configured to selectively output an output of the setup timing tester or an output of the hold timing tester based on a selection signal,
- wherein the apparatus is configured to measure the timing margin in the semiconductor circuit based on an output of the selector indicating whether the setup or hold time violation has occurred.

22. The apparatus of claim 21, wherein the setup timing tester comprises:
- a clock sync oscillator configured to output the first oscillation signal in synchronization with the first clock signal;
- a pulse generator configured to delay the first oscillation signal responsive to the control signal and output the first pulse using a clock signal of the second clock set; and
- a time violation tester configured to determine whether the first oscillation signal has a same value as the first pulse and indicate that a setup time violation has occurred when the first oscillation signal does not have the same value as the first pulse.

23. The apparatus of claim 22, wherein the clock sync oscillator comprises:
- a first D flip-flop configured to latch the first oscillation signal in synchronization with the first clock signal; and
- an inverter configured to invert an output of the first D flip-flop and output the inverted output of the first D flip-flop as the first oscillation signal.

24. The apparatus of claim 23, wherein the pulse generator comprises:
- a plurality of delay units connected in series and respectively configured to delay the first oscillation signal;
- a selector configured to receive a plurality of outputs respectively corresponding to the plurality of delay units and select and output one of the plurality of outputs responsive to the control signal; and
- a second D flip-flop configured to latch an output of the selector in synchronization with a last clock signal of the second clock set.

25. The apparatus of claim 24, wherein the time violation tester comprises:
- an exclusive OR gate configured to indicate whether the output of the first D flip-flop is synchronized with an output of the second D flip-flop.

26. The apparatus of claim 25, wherein the time violation tester further comprises:
- an inverter configured to invert an output of the exclusive OR gate; and
- a third D flip-flop configured to latch an output of the inverter in synchronization with the last clock signal of the second clock set.

27. The apparatus of claim 26, wherein the time violation tester further comprises:
- a delay unit between the exclusive OR gate and the inverter and configured to prevent the setup time violation.

28. The apparatus of claim 21, wherein the hold timing tester comprises:
- a clock sync oscillator configured to output the second oscillation signal in synchronization with the second clock signal of the first clock set;
- a pulse generator configured to delay the plurality of clock signals of the second clock set responsive to the control signal, receive the second oscillation signal, and generate the second pulse using the delayed plurality of clock signals of the second clock set; and
- a time violation tester configured to determine whether the second oscillation signal has a same value as the second pulse and indicate that a hold time violation has occurred when the second oscillation signal does not have the same value as the second pulse.

29. The apparatus of claim 28, wherein the clock sync oscillator comprises:
- a first D flip-flop configured to latch the second oscillation signal in synchronization with the second clock signal of the first clock set; and
- an inverter configured to invert an output of the first D flip-flop and output the inverted output of the first D flip-flop as the second oscillation signal.

30. The apparatus of claim 29, wherein the pulse generator comprises:
- a selector configured to receive the plurality of clock signals of the second clock set and select one of the plurality of clock signals of the second clock set responsive to the control signal; and
- a second D flip-flop configured to latch the second oscillation signal in synchronization with the selected one of the plurality of clock signals output from the selector to thereby generate the second pulse.

31. The apparatus of claim 30, wherein the time violation tester comprises:
- an exclusive OR gate configured to indicate whether the output of the first D flip-flop is synchronized with an output of the second D flip-flop.

32. The apparatus of claim 31, wherein the time violation tester further comprises:
- an inverter configured to invert an output of the exclusive OR gate; and
- a third D flip-flop configured to latch an output of the inverter in synchronization with a last clock signal of the second clock set.

33. The apparatus of claim 32, wherein the time violation tester further comprises:
- a delay unit between the exclusive OR gate and the inverter and configured to prevent the hold time violation.

34. The apparatus of claim 21, further comprising:
- an output stabilizer configured to stabilize the output of the selector.

35. The apparatus of claim 34, wherein the output stabilizer comprises:

a plurality of D flip-flops respectively configured to shift the output of the selector in synchronization with a last clock signal of the second clock set; and an AND gate configured to perform an AND operation on outputs of the plurality of D flip-flops and the output of the selector and output a result of the AND operation.

36. The apparatus of claim 35, wherein the plurality of D flip-flops respectively include a delay unit at their respective input terminals, and wherein a delay of each of the delay units is configured to prevent the setup time violation and/or the hold time violation.

37. A method for measuring on-chip characteristics of a semiconductor circuit, the method comprising:

internally generating a first oscillation signal having a desired oscillation frequency responsive to a first control signal;

generating a second oscillation signal using an input clock signal;

generating a pulse using the second oscillation signal responsive to a second control signal;

determining whether an operating time violation has occurred based on a comparison of the second oscillation signal and the pulse;

selectively providing the first oscillation signal and/or an indication of whether the operating time violation has occurred responsive to a test mode signal;

determining an on-chip delay of the semiconductor circuit based on a period of the first oscillation signal responsive to selectively providing the first oscillation signal; and determining a timing margin of the semiconductor circuit based on the indication of whether the operating time violation has occurred responsive to selectively providing the indication.

* * * * *

UNITED STATES PATENT AND TRADEMARK OFFICE
CERTIFICATE OF CORRECTION

| | | |
|---|---|---|
| PATENT NO. | : 7,408,371 B2 | Page 1 of 1 |
| APPLICATION NO. | : 11/416374 | |
| DATED | : August 5, 2008 | |
| INVENTOR(S) | : Kim et al. | |

It is certified that error appears in the above-identified patent and that said Letters Patent is hereby corrected as shown below:

<u>In the Claims:</u>

Column 13, Claim 11, Line 53: Please correct "in seriesand"
                                              To read -- in series and --

Signed and Sealed this

Fourteenth Day of October, 2008

JON W. DUDAS
*Director of the United States Patent and Trademark Office*